United States Patent
Kristof

(10) Patent No.: US 10,239,410 B2
(45) Date of Patent: Mar. 26, 2019

(54) METHOD AND ARRANGEMENT FOR CHARGING A VEHICLE BATTERY

(71) Applicant: Dr. Ing. h.c.F. Porsche Aktiengesellschaft, Stuttgart (DE)

(72) Inventor: Thomas Kristof, Karlsruhe-Palmbach (DE)

(73) Assignee: Dr. Ing. h.c. F. Porsche Aktiengesellschaft, Stuttgart (DE)

( * ) Notice: Subject to any disclaimer, the term of this patent is extended or adjusted under 35 U.S.C. 154(b) by 0 days.

(21) Appl. No.: 15/596,333

(22) Filed: May 16, 2017

(65) Prior Publication Data

US 2017/0334303 A1    Nov. 23, 2017

(30) Foreign Application Priority Data

May 18, 2016 (DE) ................. 10 2016 109 074

(51) Int. Cl.
*B60L 11/18*    (2006.01)
*G01R 31/36*    (2019.01)
(Continued)

(52) U.S. Cl.
CPC ...... *B60L 11/1818* (2013.01); *G01R 31/3637* (2013.01); *H01M 10/44* (2013.01); *H01M 10/48* (2013.01); *H01M 2220/20* (2013.01)

(58) Field of Classification Search
CPC .................................................. B60L 11/1818
(Continued)

(56) References Cited

U.S. PATENT DOCUMENTS 5,387,857 A * 2/1995 Honda ................... H02J 7/0016
                                                320/120
5,932,932 A * 8/1999 Agatsuma ................ B60K 6/48
                                                307/10.6
(Continued)

FOREIGN PATENT DOCUMENTS

DE    102013221970 A1    4/2015
DE    102014208696 A1    11/2015
(Continued)

OTHER PUBLICATIONS

German Search Report for German Application No. 10 2016 109 074.3, dated Dec. 27, 2016 with partial translation, 7 pages.
(Continued)

*Primary Examiner* — Suresh Memula
(74) *Attorney, Agent, or Firm* — RatnerPrestia

(57) ABSTRACT

A method for charging a vehicle battery which stores electrical power for an electrical drive motor of a vehicle, wherein the vehicle battery is electrically connectable to a charging socket via a switch arrangement. The method includes: measuring a first electrical variable on the switch arrangement side facing the charging socket, by a first measuring device, measuring a second electrical variable on the switch arrangement side facing the vehicle battery, by a second measuring device, comparing the first and second electrical variables and closing the switch arrangement, if the first and second electrical variables substantially correspond, measuring the first and second electrical variables while the switch arrangement is closed, and adjusting the first measuring device and the second measuring device on the basis of a first measurement difference between measurement results of the first and second electrical variables while the switch arrangement is closed.

8 Claims, 2 Drawing Sheets

(51) Int. Cl.
*H01M 10/44* (2006.01)
*H01M 10/48* (2006.01)

(58) Field of Classification Search
USPC .......................................................... 320/109
See application file for complete search history.

(56) References Cited

U.S. PATENT DOCUMENTS

| | | | | |
|---|---|---|---|---|
| 8,054,047 | B2 * | 11/2011 | Chen | .................... H02J 7/0008 320/107 |
| 9,837,837 | B2 * | 12/2017 | Wang | ....................... H02H 7/18 |
| 2009/0128158 | A1 | 5/2009 | Kawai | |
| 2009/0301801 | A1 | 12/2009 | Fujitake | |
| 2012/0313562 | A1 | 12/2012 | Murao et al. | |
| 2015/0291042 | A1 | 10/2015 | Komma et al. | |

FOREIGN PATENT DOCUMENTS

| | | | |
|---|---|---|---|
| JP | H09275639 | A | 10/1997 |
| JP | 2013226008 | A | 10/2013 |
| JP | 2014010005 | A | 1/2014 |
| WO | 2012139778 | A2 | 10/2012 |
| WO | 2014122647 | A1 | 8/2014 |
| WO | 2015169326 | A1 | 11/2015 |

OTHER PUBLICATIONS

Notification of Reason for Rejection for Japanese Application No. 2017-096145, dated Jul. 3, 2018, 6 pages.

\* cited by examiner

METHOD AND ARRANGEMENT FOR CHARGING A VEHICLE BATTERY

CROSS-REFERENCE TO RELATED APPLICATIONS

This application claims priority to German Patent Application No. 102016109074.3, filed May 18, 2016, the content of such application being incorporated by reference herein in its entirety.

FIELD OF THE INVENTION

The invention relates to a method for charging a vehicle battery, in particular a high-voltage vehicle battery, which stores electrical power for an electrical drive motor of a vehicle, wherein the vehicle battery is electrically connectable to a charging socket via a switch arrangement, comprising the steps of measuring a first electrical variable on that side of the switch arrangement which faces the charging socket, by means of a first measuring device, measuring a second electrical variable on that side of the switch arrangement which faces the vehicle battery, by means of a second measuring device, comparing the first electrical variable and the second electrical variable and closing the switch arrangement, if the first electrical variable and the second electrical variable substantially correspond.

Furthermore, the present invention relates to a charging arrangement for a motor vehicle, comprising an electrical charging socket connectable to a stationary electrical charging station, comprising a vehicle battery terminal, to which a vehicle battery is connectable, comprising a switch arrangement, by means of which the charging socket and the vehicle battery terminal are electrically connectable, comprising a first measuring device configured to measure a first electrical variable in the region of the charging socket, comprising a second electrical measuring device configured to measure a second electrical variable on that side of the switch arrangement which faces the vehicle battery, and comprising a control device.

BACKGROUND OF THE INVENTION

Electrically operated motor vehicles or electric vehicles have an electrically chargeable energy store. The latter may be configured as a high-voltage battery, the rated voltage of which may be 800 volts, for example. Such an energy store is typically charged by establishing an electrical connection between an external charging column (charging station) and a charging socket fitted to the vehicle. A switchable electrical connection is provided between the charging socket and the vehicle battery, specifically by means of the switch arrangement, which may also be referred to as a disconnector and may be embodied as a contactor, for example. The switch arrangement is initially open at the beginning of a charging process, in order to bring the voltages of the vehicle battery and of the charging socket to almost the same value. Afterward, the switch arrangement is closed and the vehicle battery is charged.

In order to measure the first and second electrical variables, for example in the form of a voltage measurement, a high measurement accuracy is required. This is because the voltage difference is permitted to be only very small for technical reasons, for legal reasons and for reasons relevant to safety.

In this case, the accuracy of the voltage measurements is also not permitted to decrease over the entire operational time of the components.

DE 10 2013 221 970 A1, which is incorporated by reference herein, describes a charging system for a plug-in vehicle which can be connected to a charging column via a windable charging cable and can be charged. In this case, the current and the voltage are measured during a charging process and the resistance of the charging cable is thus calculated.

DE 10 2014 208 696 A1, which is incorporated by reference herein, discloses a charging apparatus for an electrically operated vehicle, wherein the charging apparatus has an interface with a contact part, a power converter, a control unit and a circuit-breaker and is configured to detect a voltage between the contact part and the circuit-breaker.

Furthermore, US 2009/0128158 A1, which is incorporated by reference herein, discloses providing an apparatus for the voltage measurement of a plurality of battery modules interconnected in series. A difference voltage is determined during the discharging process of two capacitors in the charged state and in the uncharged state. A measurement error is calculated therefrom.

US 2012/0313562 A1, which is incorporated by reference herein, discloses a battery control unit for an electric vehicle that can determine the present voltage of each individual battery cell during a charging process and adapt the charging voltage.

Finally, WO 2012/139778 A2, which is incorporated by reference herein, discloses a method for charging an electric vehicle, wherein the charging current is adapted to the temperature of the electrical connection between the charging apparatus and the vehicle in order to prevent the electrical connection from overheating.

SUMMARY OF THE INVENTION

Against this background described herein is an improved method for charging a vehicle battery and an improved charging arrangement in a motor vehicle or for a motor vehicle.

The method according to aspects of the invention advantageously makes it possible to carry out an adjustment of voltage measurements or measurements of other electrical variables during a vehicle battery charging process.

If the switch arrangement is closed, the first and second electrical variables should be exactly identical on account of the spatial proximity. However, if the measuring devices yield different measurement results, then it can be assumed that one of measuring devices needs to be adjusted to match the other.

Preferably, in one embodiment, the first measuring device is adjusted, that is to say that measuring device which is arranged on that side of the switch arrangement which faces the charging socket.

If a measurement difference arises, a correction factor for the measuring devices can be calculated and integrated or incorporated into software of the measuring devices.

Preferably, such an adjustment is carried out during each charging process. It is thereby possible to keep the accuracy of the measurement of the electrical variables high over the entire operational time.

For a case in which the voltage of the charging station used and that of the battery differ, a converter unit, for example in the form of a DC/DC converter, may also be provided between the charging socket and the vehicle battery. In this case, it is advantageous if a third measuring device is provided, which is arranged between the switch arrangement and the converter unit. Furthermore, the switch unit for this case generally does not comprise two switches, as in one basic embodiment, but rather three individual switches.

In this case, either a measuring device between the switch arrangement and the charging socket may be adjusted, and/or a measuring device between the switch arrangement and the converter unit may be adjusted.

It goes without saying that the features mentioned above and those yet to be explained below can be used not only in the combination respectively indicated, but also in other combinations or by themselves, without departing from the scope of the present invention.

BRIEF DESCRIPTION OF THE DRAWINGS

Exemplary embodiments of the invention are illustrated in the drawing and are explained in greater detail in the following description. In the figures.

DETAILED DESCRIPTION OF THE INVENTION

Figure 1:
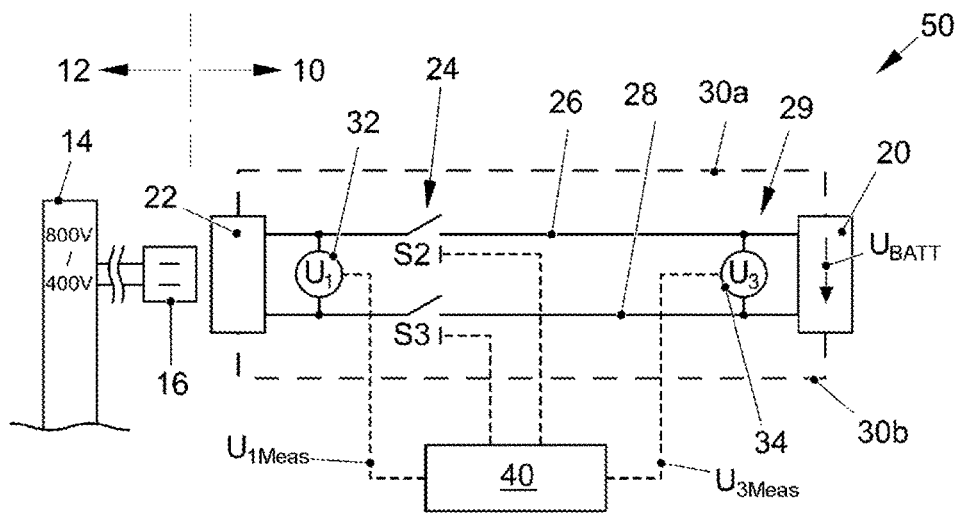
FIG. 1 shows a schematic illustration of a vehicle with a charging arrangement at a charging station.

FIG. 1 schematically illustrates a motor vehicle 10 arranged at a charging station 12. The charging station 12 has a charging terminal 14, which can provide for example a charging voltage with a magnitude of 400 volts or a charging voltage with a magnitude of 800 volts. The charging terminal 14 is connected, generally via a cable, to a charging plug 16 at which the charging voltage is provided.

A vehicle battery 20 is arranged on the vehicle 10, said vehicle battery serving for storing electrical power for an electrical drive motor of the vehicle 10, that is to say generally having a capacity of more than one kilowatt-hour, in particular of more than 10 kilowatt-hours.

Furthermore, a charging socket 22 is arranged on the vehicle 10, into which charging socket the charging plug 16 can be plugged. The charging socket 22 is preferably provided on the exterior of a vehicle bodywork.

A switch arrangement 24 is provided between the charging socket 22 and the vehicle battery 20, said switch arrangement having a first switch S2 and a second switch S3 in the present case. The switches may be configured as disconnectors for high-voltage applications, for example as contactors.

The first switch S2 is arranged in a first line 26 between the charging socket 22 and the vehicle battery 20. The second switch S3 is arranged in a second line 28 between the charging socket 22 and the vehicle battery 20.

The vehicle battery 20 is connected to the first line 26 and the second line 28 in the region of a vehicle battery terminal 29.

The charging socket 22 and the vehicle battery 20 are furthermore coupled to one another via communication lines 30a, 30b and a control unit. Said communication lines are generally bidirectional.

The illustration does not show that the charger can also be in communication, preferably likewise bidirectionally, with the charging station 12 via the charging socket 22 and the charging plug 16.

A first measuring device for measuring a first electrical variable, an electrical voltage $U_1$ in the present case, is provided between the switch arrangement 24 and the charging socket 22. A second measuring device 34 for measuring a second electrical variable, preferably the electrical voltage $U_3$, is provided between the switch arrangement 24 and the vehicle battery 20 or the vehicle battery terminal 29.

The first measuring device 32 supplies a first measurement result $U_{1meas}$ to a control device. Correspondingly, the second measuring device 34 supplies a measurement result $U_{3meas}$ to the control device 40.

Overall, FIG. 1 illustrates a charging arrangement 50 for a motor vehicle 10.

Figure 2:
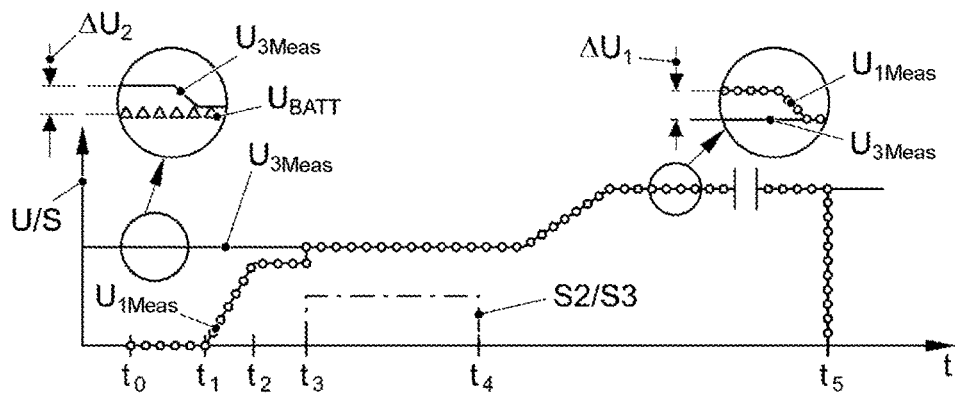
FIG. 2 shows a timing diagram of electrical measurement variables and of switch positions of a switch arrangement.

FIG. 2 shows a timing diagram of a charging process.

At a point in time $t_0$, the charging plug 16 is connected to the charging socket 22. At this point in time, the switches S2, S3 of the switch arrangement are open. At a point in time $t_1$, firstly a so-called "precharge" process begins, in which the charging voltage $U_1$ is adapted or set to a setpoint value corresponding to the voltage $U_3$. If the charging voltage has attained the setpoint value at $t_2$, the switches S2, S3 can be closed at $t_3$ and an adjustment of the charging voltage $U_1$ and the voltage $U_3$ can be carried out.

The charging process ends at the point in time $t_4$, such that no electrical current is exchanged between the charging socket 22 and the battery 20. Since the switches S2, S3 are closed at this point in time, it is possible to adjust the voltages $U_1$ and $U_3$ in the heated state of the switches S1, S2, S3. At the point in time $t_5$ after adjustment has been carried out, the switches S2, S3 are opened again.

The adjustment is carried out because, for the case where the switch arrangement 24 is closed, the measurement results $U_{1meas}$ and $U_{3meas}$ should actually be identical, in particular on account of the spatial proximity within the vehicle.

Therefore, upon the occurrence of a measurement difference $\Delta U_1$, it is assumed that the first measuring device 32 supplies a certain incorrect measurement that needs to be corrected, namely by the adjustment according to aspects of the invention.

Figure 3:
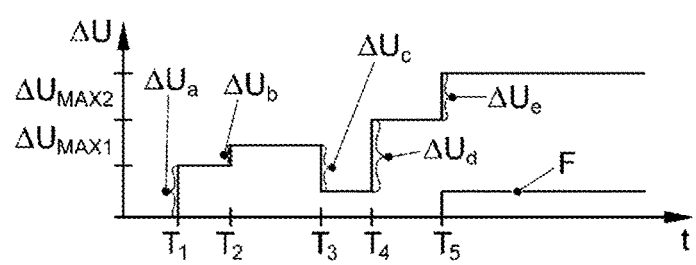
FIG. 3 shows a temporal sequence of successive adjusting processes with respective measurement differences.

FIG. 3 illustrates that respective adjusting processes are carried out at different points in time $T_1$, $T_2$. Measurement differences can respectively occur here, which are respectively shown schematically by $\Delta U_a$, $\Delta U_b$, etc.

If a measurement difference $\Delta U$ occurs, then it must not be greater than a first predefined difference threshold value $\Delta U_{MAX1}$. Otherwise, an error message is output since it can be assumed that the measuring device is defective.

On the other hand, it is possible to sum the measurement differences $\Delta U$ over the successive adjusting processes. Consequently, a summation value of measurement differences always results. In this case, the measurement differences can assume positive or negative values. By way of example, the measurement difference $\Delta U_c$ is negative such that the sum of the measurement differences after $T_3$ is smaller again than before $T_3$.

At the point in time $T_5$, the sum of the measurement differences exceeds a second difference threshold value $\Delta U_{MAX2}$. This means that it is assumed that the affected measuring device is defective, such that an error signal F is output at the point in time $T_5$.

$\Delta U_{MAX2}$ is preferably greater than $\Delta U_{MAX1}$.

Figure 4:
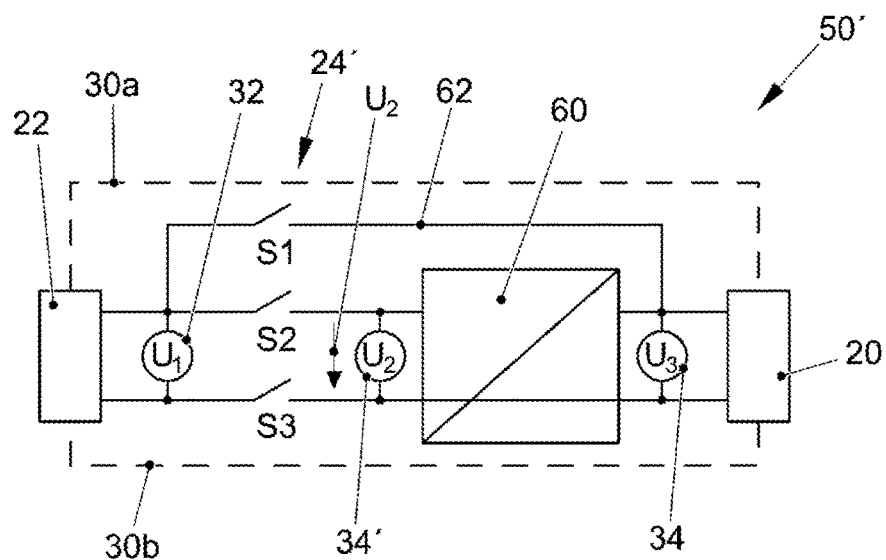
FIG. 4 shows an illustration, comparable to FIG. 1, of a further embodiment of a charging arrangement.

FIG. 4 shows a further embodiment of a charging arrangement 50', which corresponds generally to the charging arrangement 50 in FIG. 1 with regard to construction and functioning. Identical elements are therefore identified by identical reference signs. Substantially the differences are explained below.

In the case of the charging arrangement 50', a converter unit 60 is provided between the switch arrangement 24' and the vehicle battery 20, which converter unit may be configured for example as a DC/DC converter, in particular as a DC/DC booster.

Furthermore, a third line 62 with a third switch S1 is provided between the first measuring device 32 and the second measuring device 34.

In addition thereto, a further measuring device 34' for measuring the electrical voltage $U_2$ is provided between the switch arrangement 24' and the converter unit 60.

If the charging socket 22 is connected to a charging station 14 that provides for example a first charging voltage, such as 800 volts, for example, the switches S1, S3 are closed for the purpose of charging. If the charging station connected to the charging socket 22 supplies a second, lower charging voltage, of 400 volts, for example, the switches S2, S3 are closed for the purpose of charging such that the charging process is carried out via the converter unit 60, which boosts the low charging voltage provided at the charging socket 22 to a higher voltage for the high-voltage battery, for example 800 volts.

During a charging process at a charging station in which the low charging voltage is provided and the converter unit 60 is used, the measuring device 34' can be adjusted with the measuring device 32 specifically in the same way as described above for the adjustment of the measuring device 32 to match the measuring device 34.

Figure 5:
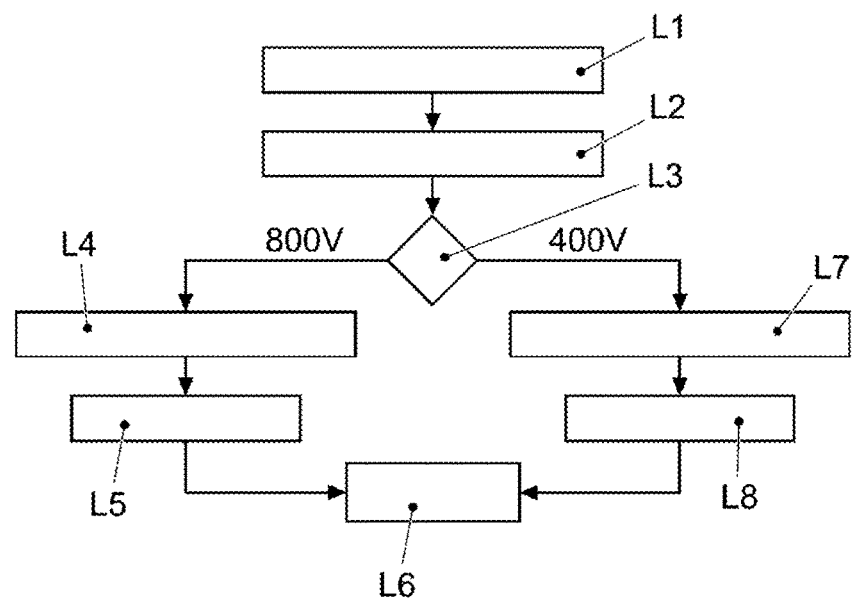
FIG. 5 shows a schematic illustration of a flow diagram of a charging method according to aspects of the invention.

FIG. 5 shows a method for charging a vehicle battery. In a step L1, a charging arrangement is in a quiescent state.

A step L2 involves adjusting the second measuring device 34 to the battery voltage, that is to say adjusting $U_3$ to $U_{BATT}$.

A step L3 involves deciding whether a charging process is carried out at a high-voltage charging station with 800 volts or at a normal charging station with 400 volts.

If a charging process is carried out at a high-voltage charging station with 800 volts, step L4 involves initiating the charging process at such a charging station.

Step L5 involves adjusting $U_1$ to $U_3$.

The charging process is ended in step L6.

If, on the other hand, in step L3 it is decided that the charging process is carried out at a charging station with 400 volts, the charging process begins at such a charging station in step L7.

Step L8 involves adjusting $U_2$ to $U_1$.

Overall, in accordance with DIN 61851-23 it is provided that a vehicle must be disconnectable from the charging socket by means of a switch arrangement or a disconnector (contactors). If a charging cable with a charging plug is plugged in, a charging process is started. In this case, the switch arrangement 24; 24' is initially open. Afterward, a preparation takes place prior to charging "precharge", in which the voltage at the charging socket (voltage $U_1$), that is provided by the charging station is adjusted to the voltage of the vehicle battery 20 (voltage measurement $U_3$). If the measurement difference between $U_1$ and $U_3$ is less than a limit value, the switch arrangement 24 or. 24' is permitted to be closed.

According to DIN 61851-22, a limit value for the voltage difference between $U_1$ and $U_3$ is exactly 20 volts. This limit value is preferably even smaller, for example 10 volts. Assuming that the maximum voltage is 800 volts, said 10 volts correspond to exactly 1.25% of 800 volts. A measurement accuracy of at least 1.25% is thus necessary for $U_1$ and $U_3$ in order to be able to assess the voltage difference. Including safety factors the requirement thus arises that the accuracy of the voltage measurement must be smaller than 1%. Preferably over the envisaged 15-year operational time of the component and all temperature ranges, this requirement can generally be fulfilled only with difficulty, which results in an expensive and complex measuring circuit in the prior art.

According to aspects of the invention, the switch arrangement 24 or 24' is closed after a successful preparation process (voltage adaptation). As a result of the spatial proximity of the measuring devices $U_1$ and $U_3$, it can be assumed that $U_{1actual}=U_{3actual}$. This phase of the charging process can be utilized in order to adjust the measuring devices to match one another or with respect to one another (this preferably involves generating a correction factor that is stored in software for one of the two measuring devices). As a result of heating of the component it is possible to determine a plurality of correction factors for different temperatures.

Since such an adjustment can be carried out during each charging process, it is possible for the two measuring devices for $U_1$ and $U_3$ not to drift apart over their lifetime. It is thus possible to use simpler measuring circuits which by themselves could not fulfil the measuring accuracy requirements over the lifetime.

The principle according to aspects of the invention can be applied to voltage measurements, but to current measurements if operating states arise in which the assumption that the currents of different sensors have the same value is legitimate.

The correction factor of a sensor or of a measuring device can be monitored to a maximum possible value (for example $\Delta U_{MAX2}$). The limitation can be implemented both absolutely and temporally. If such a value is attained, it can be assumed that a defect of the measuring device is present.

What is claimed is:

1. A method for charging a vehicle battery which stores electrical power for an electrical drive motor of a vehicle, wherein the vehicle battery is electrically connectable to a charging socket via a switch arrangement, comprising:
    measuring a first electrical variable ($U_1$) on a side of the switch arrangement facing the charging socket using a first measuring device,
    measuring a second electrical variable ($U_3$; $U_2$) on a side of the switch arrangement facing the vehicle battery using a second measuring device,
    comparing the first electrical variable ($U_1$) and the second electrical variable ($U_3$; $U_2$);
    closing the switch arrangement if the first electrical variable ($U_1$) and the second electrical variable ($U_3$; $U_2$) substantially correspond,
    measuring the first electrical variable ($U_1$) and the second electrical variable ($U_3$; $U_2$) while the switch arrangement is closed, and
    adjusting at least one of the first measuring device and the second measuring device on the basis of a first measurement difference ($\Delta U_1$) between measurement results of the first ($U_1$) and the second electrical variable ($U_3$; $U_2$) while the switch arrangement is closed.

2. The method as claimed in claim 1, wherein the second electrical variable ($U_3$) and an electrical battery variable ($U_{BATT}$) are measured before the switch arrangement is closed, wherein the second measuring device is adjusted on the basis of a second measurement difference ($\Delta U_1$) between the second electrical variable ($U_3$) and the electrical battery variable ($U_{BATT}$).

3. The method as claimed in claim 1, wherein the second electrical variable ($U_3$) is measured at the vehicle battery.

4. The method as claimed in claim 1, wherein the second electrical variable ($U_2$) is measured in a region between the switch arrangement and a converter unit connected between the switch arrangement and the vehicle battery.

5. The method as claimed in claim 1, wherein, for a case where a measurement difference ($\Delta U$) exceeds a predetermined first difference threshold value ($\Delta U_{MAX1}$), an error message (F) is output.

6. The method as claimed in claim 1, wherein measurement differences ($\Delta U_a$, $\Delta U_b$, . . . ) of successive adjusting processes ($T_1$, $T_2$, . . . ) are summed, wherein an error message (F) is output if the sum of the measurement differences that is calculated exceeds a predetermined second difference threshold value ($\Delta U_{MAX2}$).

7. The method as claimed in claim 1, wherein the first electrical variable ($U_1$) and the second electrical variable ($U_3$; $U_2$) are in each case an electrical voltage or an electrical current or an electrical resistance.

8. A charging arrangement for a motor vehicle, comprising:
   an electrical charging socket connectable to a stationary electrical charging station,
   a vehicle battery terminal, to which a vehicle battery is connectable,
   a switch arrangement, by which the charging socket and the vehicle battery terminal are electrically connectable,
   a first measuring device configured to measure a first electrical variable ($U_1$) in a region of the electrical charging socket,
   a second electrical measuring device configured to measure a second electrical variable ($U_3$; $U_2$) on a side of the switch arrangement facing the vehicle battery, and
   a control device configured to control the switch arrangement, monitor the first and second measuring devices, and adjust at least one of the first and second measuring devices on the basis of a first measurement difference between measurement results of the first and the second electrical variables while the switch arrangement is closed.

* * * * *